(12) United States Patent
Fujimoto

(10) Patent No.: US 8,154,943 B2
(45) Date of Patent: Apr. 10, 2012

(54) SEMICONDUCTOR INTEGRATED CIRCUIT

(75) Inventor: Yukihiro Fujimoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 236 days.

(21) Appl. No.: 12/726,647

(22) Filed: Mar. 18, 2010

(65) Prior Publication Data

US 2010/0238752 A1    Sep. 23, 2010

(30) Foreign Application Priority Data

Mar. 19, 2009   (JP) ................................. 2009-068965

(51) Int. Cl.
*G11C 5/14* (2006.01)
(52) U.S. Cl. ..................... 365/226; 365/230.05; 365/205
(58) Field of Classification Search .................. 365/226, 365/230.05, 205, 203, 207, 149, 189.15, 365/189.16, 230.06, 49, 230.08, 63, 51, 230.03
See application file for complete search history.

(56) References Cited

U.S. PATENT DOCUMENTS

| 6,044,034 A * | 3/2000 | Katakura ................. 365/230.05 |
| 7,940,581 B2 * | 5/2011 | Arsovski et al. ......... 365/189.15 |
| 2008/0019206 A1 | 1/2008 | Kenkare et al. |

FOREIGN PATENT DOCUMENTS

JP        2008047180        2/2008

* cited by examiner

*Primary Examiner* — Dang Nguyen
(74) *Attorney, Agent, or Firm* — Sprinkle IP Law Group

(57) ABSTRACT

A semiconductor integrated circuit includes a first region configured to operate at a specified first voltage, a second region configured to operate at a varying second voltage, and a memory device formed between the first region and the second region so as to straddle the first and second regions, wherein the memory device comprises a first port driven at the first voltage to transmit an output signal to and receive an input signal from the first region, a second port driven at the second voltage to transmit an output signal to and receive an input signal from the second region, and a memory cell accessed by the first and second ports.

11 Claims, 4 Drawing Sheets

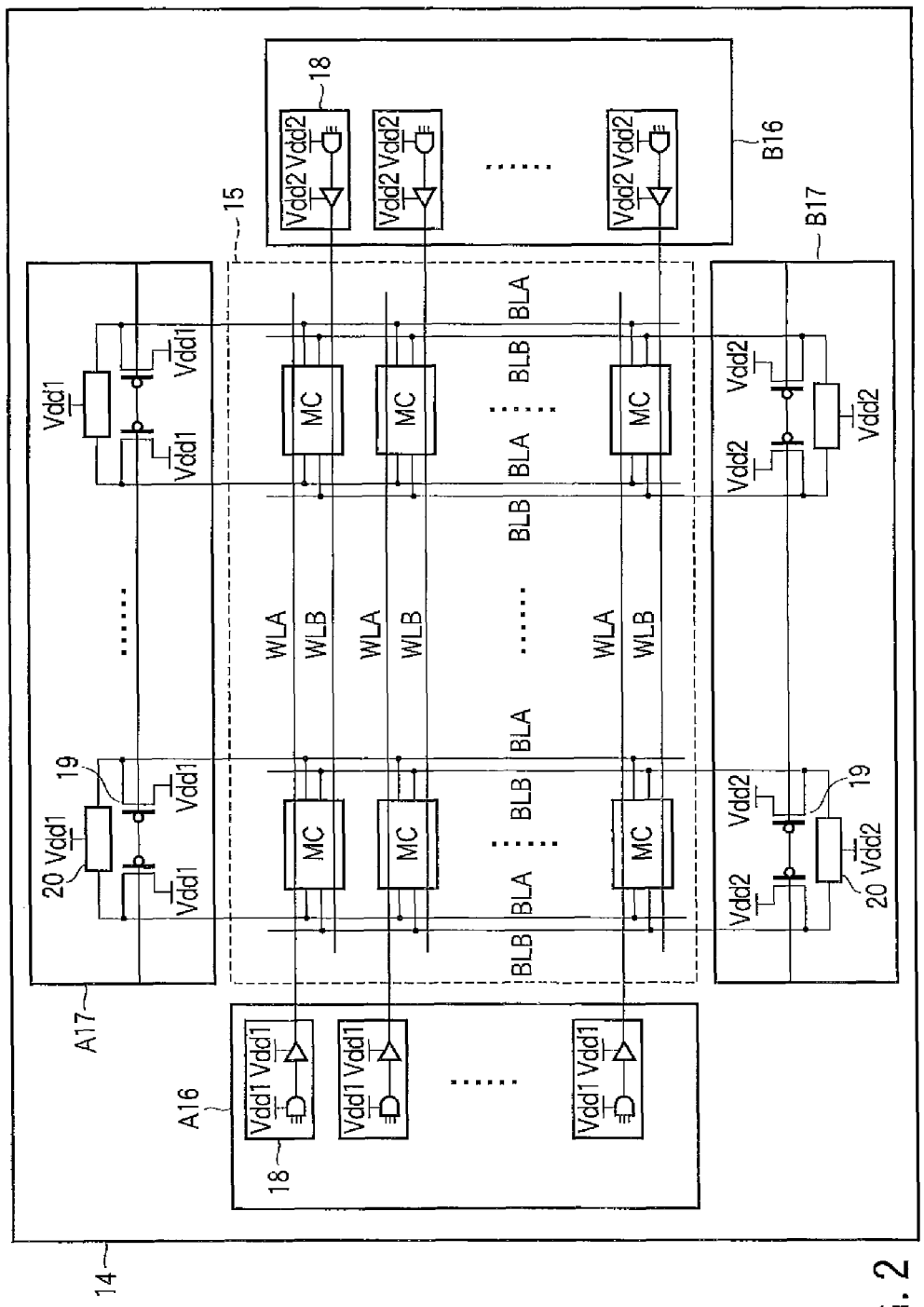
F I G. 2

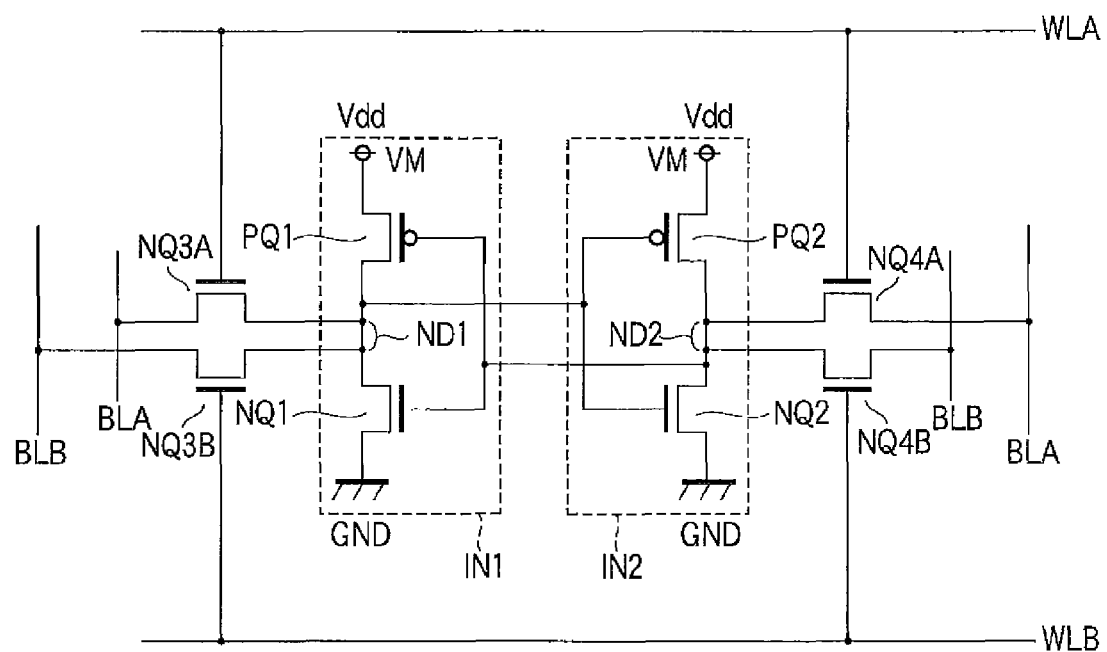
F I G. 3

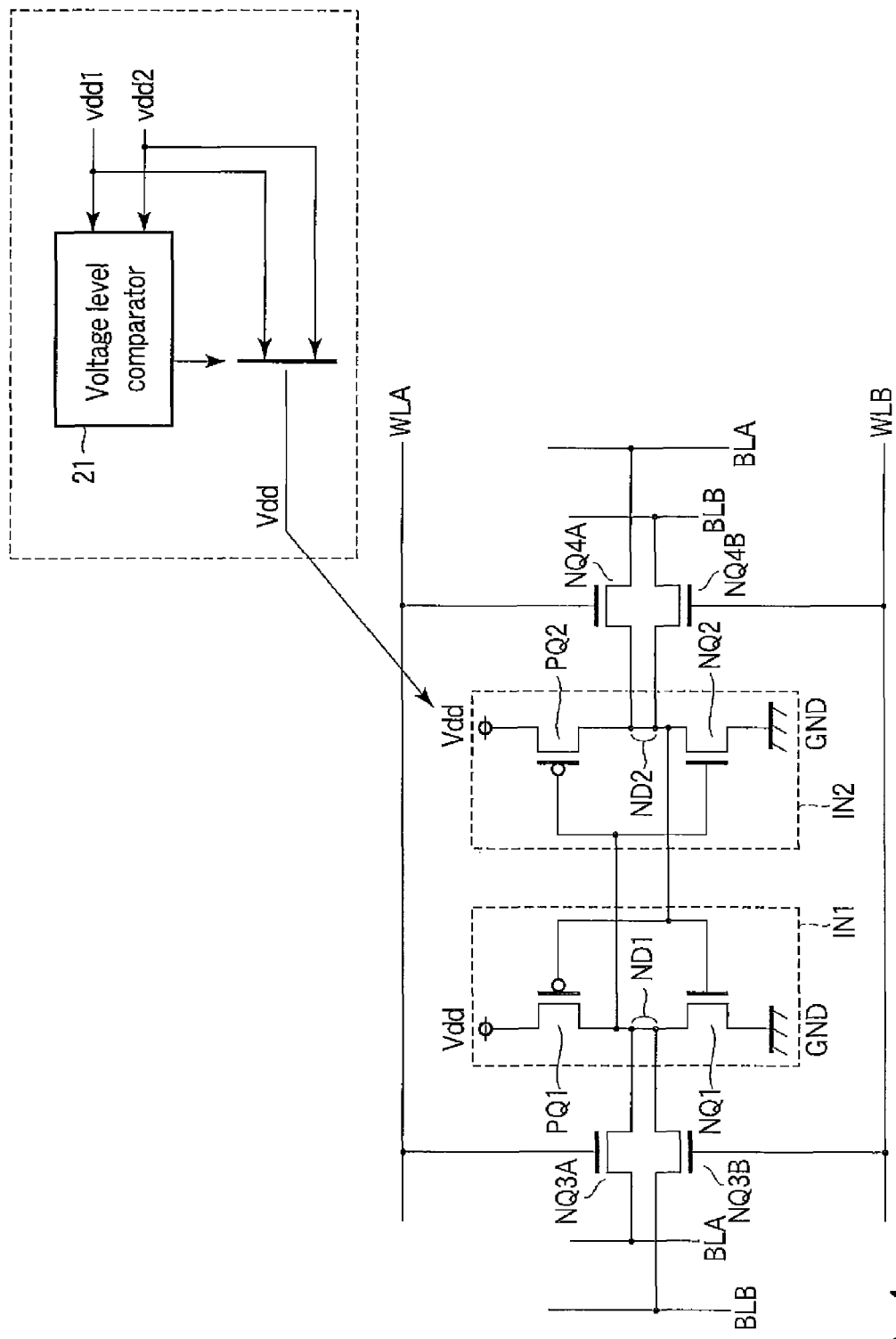
F I G. 4

SEMICONDUCTOR INTEGRATED CIRCUIT

CROSS-REFERENCE TO RELATED APPLICATIONS

This application is based upon and claims the benefit of priority from prior Japanese Patent Application No. 2009-068965, filed Mar. 19, 2009, the entire contents of which are incorporated herein by reference.

BACKGROUND OF THE INVENTION

1. Field of the Invention

The present invention relates to a memory device mounted in a semiconductor integrated circuit.

2. Description of the Related Art

In recent years, a voltage ID (VID) that allows a power supply voltage to be supplied in accordance with chip performance has been adopted for system LSIs in order to reduce current consumption and to improve LSI performance.

For example, an application-specific integrated circuit (ASIC) core is a region in a system LSI for which VID is adopted. However, a chip includes regions such as an input/output (I/O) circuit and other analog blocks for which power supply voltage standards are specified and for which the power supply voltage is not adjusted using VID. Hence, the chip includes a mixture of regions for which the power supply voltage is adjusted using VID and which use various power supply voltages and regions for which the power supply voltage is not adjusted using VID and for which the power supply voltage is fixed.

Furthermore, the phase of a clock or an operating frequency may vary among regions that use different power supply voltages. Thus, when data is transmitted and received between regions that use different power supply voltages, a phase shift in the clock or a difference in operating frequency is corrected so that data is transmitted and received with different clocks and operating frequencies used for the regions that use different power supply voltages. To achieve this, a memory device with a plurality of asynchronous ports is used (see, for example, Jpn. Pat. Appln. KOKAI Publication No. 2008-47180). That is, when transmitted from one region, data is temporarily stored in a memory device, and another region reads the data from the memory device.

The memory device conventionally operates using a single power supply voltage. Thus, the following configuration is required: the memory device is located in one of the regions that use different power supply voltage, and the regions are connected together by a level conversion circuit or a buffer circuit at the boundary between the regions.

In this case, timings for transmitting and receiving signals for a setup time, a hold time, and the like input to the region that uses the fixed power supply voltage are varied by the power supply voltage for the region for which the power supply voltage varies. Thus, the power supply voltage for the region for which the power supply voltage varies needs to be taken into account for timings for transmitting and receiving the signals to and from the region that uses the fixed power supply voltage.

As described above, the power supply voltages for the respective regions need to be taken into account in analyzing the timings for transmitting and receiving the signals. Hence, the analysis is disadvantageously complicated.

Moreover, all the power supply voltages used for the regions for which the power supply voltage is adjusted using VID need to be taken into account. This disadvantageously contributes to reducing the margins of the timings at which the respective regions transmit and receive the signals.

BRIEF SUMMARY OF THE INVENTION

According to a first aspect of the present invention, there is provided a semiconductor integrated circuit comprising a first region configured to operate at a specified first voltage, a second region configured to operate at a varying second voltage, and a memory device formed between the first region and the second region so as to straddle the first and second regions, wherein the memory device comprises a first port driven at the first voltage to transmit an output signal to and receive an input signal from the first region, a second port driven at the second voltage to transmit an output signal to and receive an input signal from the second region, and a memory cell accessed by the first and second ports.

BRIEF DESCRIPTION OF THE SEVERAL VIEWS OF THE DRAWING

FIG. 2 is a diagram showing the configuration of a memory device;

FIG. 3 is a diagram showing an example of the configuration of a memory cell; and FIG. 4 is a diagram showing an example of the configuration of a memory cell.

DETAILED DESCRIPTION OF THE INVENTION

Figure 1:
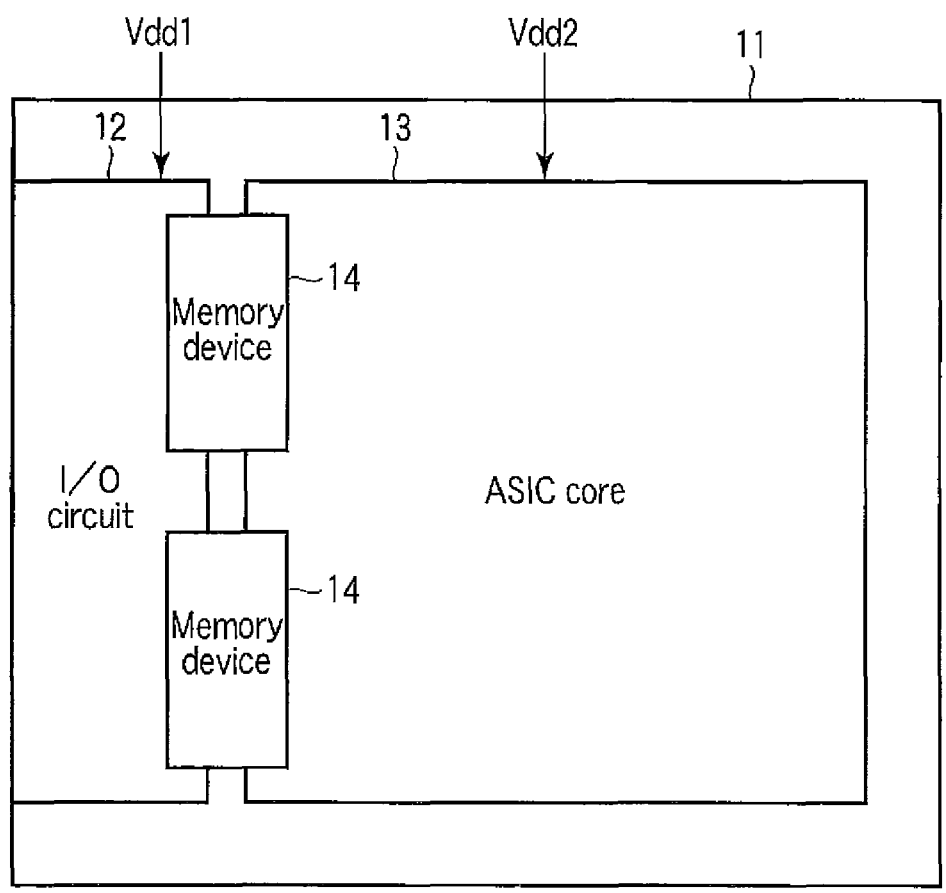
FIG. 1 is a diagram showing the configuration of a semiconductor integrated circuit.

A mode for carrying out the present invention will be described below in detail with reference to the drawings.

1. Summary

In an example of the present invention, a memory device is formed between an I/O circuit for which a power supply voltage is not adjusted using VID and which uses a fixed power supply voltage and an ASIC core for which the power supply voltage is adjusted using VID and which uses various power supply voltages.

Moreover, the memory device formed between the I/O circuit and the ASIC core includes two asynchronous ports. All circuits except a memory cell array, such as an address decoder, a read/write circuit, and a control circuit, are independently provided for each of the two ports. Furthermore, one of the ports is connected to a power supply voltage used for the I/O circuit. The other port is connected to a power supply voltage used for the ASIC core. Thus, the memory device can operate either at the power supply voltage for the I/O circuit or at the power supply voltage for the ASIC core.

Hence, for example, timings at which the I/O circuit transmits and receives signals to and from the memory device in order to access the memory device are not affected by the power supply voltage for the ASIC core because the memory device internally also uses the power supply voltage for the I/O circuit. As a result, the timings for transmitting signals between the regions with the different power supply voltages appear to be always constant without being affected by the different power supply voltages, as viewed from the respective regions. This facilitates timing analysis for transmission of signals the regions with the different power supply voltages.

2. Embodiment

FIG. 1 shows a part of a chip according to an embodiment of the present invention.

The chip 11 according to the present invention comprises, for example, an I/O circuit 12, an ASIC core 13, and a memory circuit 14.

The I/O circuit 12 is formed in a region in which the power supply voltage is not adjusted using VID. The I/O circuit 12 is connected to a fixed power supply voltage Vdd1.

A voltage supplied to the ASIC core 13 in accordance with chip performance is adjusted using VID, in order to reduce current consumption and to improve LSI performance. As a result, a power supply voltage Vdd2 connected to the ASIC core is not fixed but varies appropriately.

The memory device 14 is used to correct a phase shift in a clock or a difference in operating frequency when data is transmitted and received between the I/O circuit 12 and the ASIC core 13 so that the data can be transmitted and received with different clocks and operating frequencies used for the I/O circuit 12 and the ASIC core 13.

Furthermore, in the embodiment of the present invention, the memory device 14 is formed so as to straddle the I/O circuit 12 and the ASIC core 13.

FIG. 2 shows the configuration of the memory device.

The memory device 14 comprises a memory cell array 15 and two asynchronous ports A16, A17 and B16, B17.

In the memory cell array 15, a plurality of memory cells MC are formed in a matrix. Furthermore, the memory cell MC comprises, for example, SRAM.

All circuits except the memory cell array 15 are each separated into one for ports A16, A17 and one for ports B16, B17. That is, an address decoder 18, a bit line precharge circuit 19, a read circuit and write circuit 20 are formed for each port. Furthermore, ports A16, A17 are connected to a power supply voltage Vdd1 used for the I/O circuit. Ports B16, B17 are connected to a power supply voltage Vdd2 used for the ASIC core.

Furthermore, in association with each memory cell MC row, each of the memory cells MC is connected to a word line WLA extending from the address decoder 18 for port A16 and to a word line WLB extending from the address decoder 18 for port B16.

Moreover, in association with each memory cell MC column, each of the memory cells MC is connected to a bit line pair BLA extending from the read circuit and write circuit 20 for port A17 and to a bit line pair BLB extending from the read circuit and write circuit 20 for port B17.

The address decoder 18 for port A16 selects and drives a word line WLA in accordance with an address signal from the I/O circuit.

The address decoder 18 for port B16 selects and drives a word line WLB in accordance with an address signal from the ASIC circuit.

For each bit line pair, the bit line precharge circuit 19 precharges the bit lines to predetermined voltages.

The write circuit for port A17 generates write data to be written to the memory cells, in accordance with data received from the I/O circuit. Moreover, the read circuit for port A17 subjects data sensed and amplified by a sense amplifier to buffer processing to generate read data.

The write circuit for port B17 generates write data to be written to the memory cells, in accordance with data received from the ASIC core. Moreover, the read circuit for port B17 subjects data sensed and amplified by a sense amplifier to buffer processing to generate read data.

As described above, ports A16, A17 and B16, B17 are connected to the different power supply voltages. Thus, the memory device can be driven independently with power supply voltage Vdd1 and with power supply voltage Vdd2.

FIG. 3 is a diagram showing an example of the configuration of the memory cell MC.

The memory cell MC comprises inverters IN1 and IN2. Inverter IN1 comprises a P-channel MOS transistor PQ1 connected between a power supply line VM for the memory cell and a storage node ND1, and an N-channel MOS transistor NQ1 connected between storage node ND1 and a ground line GND. Inverter IN2 comprises a P-channel MOS transistor PQ2 connected between a power supply line VM for the memory cell and a storage node ND2, and an N-channel MOS transistor NQ2 connected between storage node ND2 and a ground line GND.

The gates of P-channel MOS transistor PQ1 and N-channel MOS transistor NQ1 are both connected to storage node ND2. The gates of P-channel MOS transistor PQ2 and N-channel MOS transistor NQ2 are both connected to storage node ND1.

The gates of N-channel MOS transistor NQ3A and NQ4A connected between storage node ND1 and bit line BLA are each connected to word line WLA. The gates of N-channel MOS transistor NQ3B and NQ4B connected between storage node ND2 and bit line BLA are each connected to word line WLB.

In this memory cell configuration, the inputs and outputs of inverters IN1 and IN2 are cross-linked together to form an inverter latch. Thus, complementary data are stored in storage nodes ND1 and ND2.

For power supply voltage Vdd for the memory cell, the memory cell may be connected to one of power supply voltage Vdd1 used for the I/O circuit and power supply voltage Vdd2 used for the ASIC core. Alternatively, a new voltage different from power supply voltages Vdd1 and Vdd2 may be generated as power supply voltage Vdd for the memory cell. Alternatively, an approximately intermediate voltage between power supply voltages Vdd1 and Vdd2 may be newly generated as power supply voltage Vdd for the memory cell.

As descried above, the memory device with the two ports is provided between the I/O circuit and the ASIC core. Furthermore, the other circuits except the memory cell array, such as the address decoder, the read/write circuit, and the control circuit are formed for each of the two ports. Moreover, port A is connected to the power supply voltage for the I/O circuit, and port B is connected to the power supply voltage for the ASIC core. Thus, the memory device can be driven independently with power supply voltage Vdd1 and with power supply voltage Vdd2. As a result, timings at which the I/O circuit transmits and receives signals to and from the memory device in order to access the memory device are not affected by power supply voltage Vdd2 for the ASIC core because the memory device internally also uses power supply voltage Vdd1. In contrast, timings at which the ASIC core transmits and receives signals to and from the memory device in order to access the memory device are not affected by power supply voltage Vdd1 for the I/O circuit because the memory device internally also uses power supply voltage Vdd2.

Thus, the timings for transmitting and receiving signals between the regions with the different power supply voltages appear to be always constant without being affected by the different power supply voltages, as viewed from the respective regions. This facilitates timing analysis for transmission and reception of signals the regions with the different power supply voltages.

In the embodiment of the present invention, the margins of the timings for transmitting and receiving signals need to be taken into account for writes and reads to and from the memory cells.

Here, the voltage supplied to the ASIC core in accordance with chip performance is adjusted using VID. Thus, power supply voltage Vdd2 connected to the ASIC core is not fixed but varies appropriately. Hence, power supply voltage Vdd1 for the I/O circuit may be higher than power supply voltage Vdd2 or power supply voltage Vdd2 for the ASIC core may be higher than power supply voltage Vdd1.

Thus, if one of power supply voltages Vdd1 and Vdd2 is connected to the memory cell or a power supply voltage different from power supply voltages Vdd1 and Vdd2 is connected to the memory cell as power supply voltage Vdd, power supply voltage Vdd for the memory cell may be lower than the power supply voltages for the ports. In this case, the amplitude of the bit line pair is reduced, preventing sufficient margins from being provided for the read timings. As a result, the read timings need to be delayed in order to provide sufficient margins.

Of course, even if power supply voltage Vdd for the memory cell is lower than the power supply voltages for the ports, no problem occurs provided that sufficient margins can be provided for the read timings. However, if the power supply voltage for the memory cell is equal to or higher than those for the ports, the following is possible because the bit line has a sufficiently large amplitude, thus providing sufficient margins for the read timings. As shown in FIG. 4, to determine power supply voltage Vdd connected to the memory cell, a voltage level comparator 21 may be used to compare the magnitudes of power supply voltages Vdd1 and Vdd2 with each other so that the higher voltage is used as power supply voltage Vdd for the memory cell.

The use of the voltage level comparator 21 keeps power supply voltage Vdd connected to the memory cell equal to or higher than the power supply voltage used for the ports. Thus, this configuration is characterized by preventing the read timing speeds from being reduced.

Furthermore, if the power supply voltage for the memory cell is always equal to or higher than those for the ports, the margins of the read timings are reduced during writes. However, the circuit may be pre-adjusted within the range of the operating voltage so as to avoid affecting the I/O timings for the writes.

Thus, the power supply voltage for the memory cell can always be set equal to or higher than the power supply voltages for the ports by using the voltage level comparator 21 to determine to which port power supply voltage the memory cell is connected. As a result, regardless of how the power supply voltages are set for the respective ports, sufficient margins can be provided for the read timings. Hence, when data is input to and output from the memory cell, timings independent of the power source voltages for the ports can be provided.

3. Applications

In the embodiment of the present invention, the memory device installed between the I/O circuit and the ASIC core has been described by way of example. However, the present invention is applicable to any chip that uses a memory device as a buffer when data is transmitted and received between regions with different power supply voltages.

4. Conclusion

The present invention proposes a memory device that is not affected by different power supply voltages used for the respective regions when signals are transmitted and received between the regions.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit comprising a first region configured to operate at a specified first voltage, a second region configured to operate at a varying second voltage, and a memory device formed between the first region and the second region so as to straddle the first and second regions,
wherein the memory device comprises a first port driven at the first voltage to transmit an output signal to and receive an input signal from the first region, a second port driven at the second voltage to transmit an output signal to and receive an input signal from the second region, and a memory cell accessed by the first and second ports.

2. The circuit according to claim 1, wherein one of the first and second voltages is used as a power supply voltage for the memory cell.

3. The circuit according to claim 1, further comprising a voltage level comparator configured to compare the magnitude of the first voltage with the magnitude of the second voltage to select the higher voltage and to connect the higher voltage to the memory cell as the power supply voltage for the memory cell.

4. The circuit according to claim 1, wherein a third voltage different from the first voltage and the second voltage is used as the power supply voltage for the memory cell.

5. The circuit according to claim 4, wherein the third voltage has a magnitude between the first voltage and the second voltage.

6. The circuit according to claim 4, wherein the first port and the second port are asynchronous with each other.

7. The circuit according to claim 1, wherein the memory cell is controlled independently by the first port and by the second port.

8. The circuit according to claim 1, wherein each of the first and second ports comprises an address decoder, a bit line precharge circuit, and a read circuit and write circuit.

9. The circuit according to claim 8, wherein the memory cell is connected to the address decoder of the first port, the address decoder of the second port, the bit line precharge circuit of the first port, the bit line precharge circuit of the second port, the read circuit and write circuit of the first port, and the read circuit and write circuit of the second port.

10. The circuit according to claim 1, wherein the first region is an I/O circuit, and the second region is an ASIC core.

11. The circuit according to claim 1, wherein the memory cell is a SRAM.

* * * * *